United States Patent
Sheehan et al.

(10) Patent No.: US 9,694,735 B2
(45) Date of Patent: Jul. 4, 2017

(54) VEHICLE EMBLEM INCORPORATING CAPACITIVE SWITCH AND LED LIGHTING

(71) Applicant: Flextronics International USA, Inc., San Jose, CA (US)

(72) Inventors: Shaun Sheehan, Farmington Hills, MI (US); Kevin Roman Buermann, Lakeville, MN (US); Bruce D. Olson, Northfield, MN (US)

(73) Assignee: Flextronics International USA, Inc., San Jose, CA (US)

(*) Notice: Subject to any disclaimer, the term of this patent is extended or adjusted under 35 U.S.C. 154(b) by 0 days.

(21) Appl. No.: 14/605,262

(22) Filed: Jan. 26, 2015

(65) Prior Publication Data
US 2016/0214525 A1   Jul. 28, 2016

(51) Int. Cl.
*H04B 1/38*   (2015.01)
*B60Q 1/00*   (2006.01)
(Continued)

(52) U.S. Cl.
CPC ........ *B60Q 1/0023* (2013.01); *E05B 47/0002* (2013.01); *E05B 81/08* (2013.01);
(Continued)

(58) Field of Classification Search
CPC G07C 5/008; G07C 9/00309; G07C 2209/65; G07C 2209/64; G07C 2009/00325; G07C 2209/63; E05B 81/78; E05B 81/77; E05B 81/76; E05B 47/0002; E05B 81/08; E05Y 2400/852; E05F 15/77; E05F 15/73; E05F 15/76; B60Q 1/0023; H03K 17/955
See application file for complete search history.

(56) References Cited

U.S. PATENT DOCUMENTS 8,725,315 B2 * 5/2014 Talty .................. B60R 25/24
340/426.13
8,858,003 B2 * 10/2014 Porter ................. H03K 17/962
362/23.03
(Continued)

OTHER PUBLICATIONS

International Search Report for International Application No. PCT/US2015/023597, issued Sep. 10, 2015; 3 pages.
(Continued)

*Primary Examiner* — Tesfaldet Bocure
(74) *Attorney, Agent, or Firm* — Volpe and Koenig, P.C.

(57) ABSTRACT

A system, device and method for opening an electromechanical system of a vehicle. The system includes a capacitive emblem switch and a transponder, where the transponder includes an identifier of the vehicle. The capacitive emblem switch is activated when the user is in proximity of the vehicle with the transponder. The electromechanical system, such as a rear hatch of the vehicle opens when the user motions in front of the activated capacitive emblem switch. In embodiments, the capacitive emblem switch may be incorporated into a vehicle logo or a vehicle model number. In an embodiment, LED lights are used to indicate activation of the capacitive emblem switch. The LED lights may change color to indicate a completion of the method. The capacitive emblem switch may be transparent. The transponder may be a key fob.

17 Claims, 9 Drawing Sheets

(51) Int. Cl.
  *E05B 47/00* (2006.01)
  *E05B 81/08* (2014.01)
  *H03K 17/955* (2006.01)
  *G07C 9/00* (2006.01)
  *E05F 15/73* (2015.01)
  *E05F 15/76* (2015.01)

(52) U.S. Cl.
  CPC .............. *E05F 15/73* (2015.01); *E05F 15/76* (2015.01); *G07C 9/00309* (2013.01); *H03K 17/955* (2013.01); *E05Y 2400/818* (2013.01); *E05Y 2400/854* (2013.01); *E05Y 2900/546* (2013.01); *H03K 2217/960785* (2013.01)

(56) References Cited

U.S. PATENT DOCUMENTS

| | | | | |
|---|---|---|---|---|
| 9,102,266 | B2* | 8/2015 | Dingman | B60Q 1/2665 |
| 9,156,439 | B2* | 10/2015 | Hirota | G07C 9/00309 |
| 2002/0022979 | A1* | 2/2002 | Whipp | G06Q 10/02 705/5 |
| 2003/0216817 | A1 | 11/2003 | Pudney | |
| 2006/0025897 | A1* | 2/2006 | Shostak | B60C 23/005 701/1 |
| 2012/0123649 | A1 | 5/2012 | Eggers | |
| 2013/0107557 | A1* | 5/2013 | Dingman | B60Q 1/2665 362/501 |
| 2013/0311039 | A1* | 11/2013 | Washeleski | E05F 15/46 701/36 |
| 2014/0303811 | A1* | 10/2014 | Ledendecker | G07C 9/00944 701/2 |
| 2015/0116079 | A1* | 4/2015 | Mishra | G07C 9/00007 340/5.52 |
| 2015/0177298 | A1* | 6/2015 | Sugiura | G06F 3/044 324/658 |
| 2015/0258962 | A1* | 9/2015 | Khanu | B60R 25/2054 701/49 |
| 2015/0291126 | A1* | 10/2015 | Nicholls | B60R 25/20 701/49 |
| 2015/0308084 | A1* | 10/2015 | Thompson | G05D 23/1393 700/283 |
| 2016/0167621 | A1* | 6/2016 | Luu | E05F 15/73 701/48 |

OTHER PUBLICATIONS

Written Opinion for the International Searching Authority for International Application No. PCT/US2015/023597, Issued Sep. 10, 2015; 6 pages.

* cited by examiner

VEHICLE EMBLEM INCORPORATING CAPACITIVE SWITCH AND LED LIGHTING

FIELD OF INVENTION

This application is related to vehicle electronics.

BACKGROUND

Vehicles have a number of power entry systems which may include automatic power lift gates, trunk lids or hoods, sunroofs, sliding doors, and doors. Users may want to use a touch-less activation of the power entry systems upon approaching the vehicle or when they are in the vehicle due to security or convenience reasons.

Most of the newer vehicles are also equipped with a radio frequency (RF) system that is able to detect and verify if a key fob/transponder associated with the vehicle is in the immediate proximity of the vehicle and "wake-up" the vehicle.

Prior technology used ultrasonics or the "open-sesame" technique. In this approach, a sensor recognizes the movement of a foot as a signal to open the tail gate. It would be preferable to have a method of activation that does not require standing on one leg and also offers a visible indication of switch status.

SUMMARY

A system, device and method for opening an electromechanical system of a vehicle. The system includes a capacitive emblem switch and a transponder, where the transponder includes an identifier of the vehicle. The capacitive emblem switch is activated when the user is in proximity of the vehicle with the transponder. The electromechanical system, such as a rear hatch of the vehicle opens when the user motions in front of the activated capacitive emblem switch. In embodiments, the capacitive emblem switch may be incorporated into a vehicle logo or a vehicle model number. In an embodiment, LED lights are used to indicate activation of the capacitive emblem switch. The LED lights may change color to indicate a completion of the method. The capacitive emblem switch may be transparent. The transponder may be a key fob.

DETAILED DESCRIPTION

Figure 1:
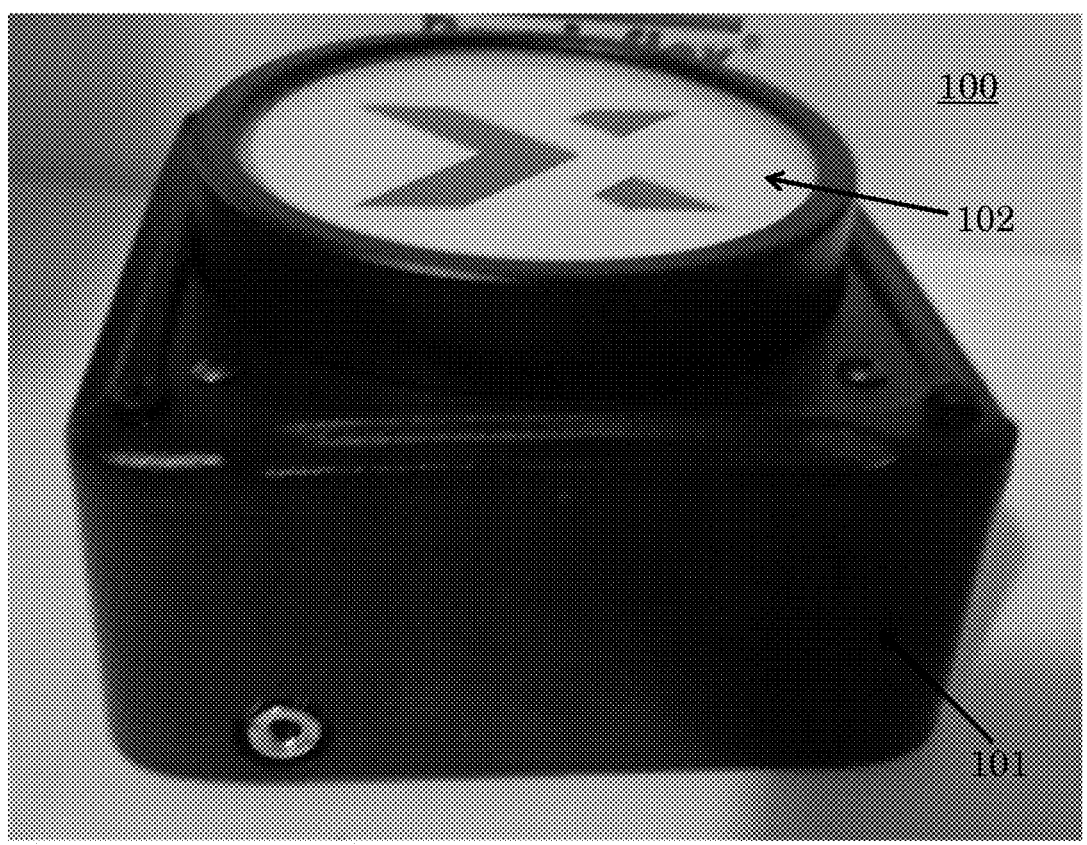
FIG. 1 is an example of a vehicle emblem.

It is to be understood that the figures and descriptions of embodiments of a system and method of activating or triggering predetermined functions for incorporating a capacitive switch and light emitting diode (LED) lighting into a vehicle emblem have been simplified to illustrate elements that are relevant for a clear understanding, while eliminating, for the purpose of clarity, many other elements found in typical vehicle systems. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

The non-limiting embodiments described herein are with respect to a system and method of incorporating a capacitive switch and LED lighting into a vehicle emblem. Other electronic devices, modules and applications may also be used in view of these teachings without deviating from the spirit or scope as described herein. The system and method of incorporating a capacitive switch and a light emitting diode (LED) lighting into a vehicle emblem may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the system and method of activating or triggering predetermined functions for incorporating a capacitive switch and LED lighting into a vehicle emblem although it may be described with respect to a particular embodiment.

A hands-free method of activating a power lift gate module may include a sensor located on a vehicle for detecting an input action by the user indicating they wish to open the power lift gate. The sensor may be a motion sensor for detecting a particular motion of the user at a particular location, for example in a vehicle emblem or the like. The motion sensor may detect movement of the user, for example a hand or arm wave, in close proximity to the vehicle. The vehicle may require an additional input, such as a key fob/transponder. The vehicle may detect the proximity of the key fob and activate the motion sensor to allow the user to perform the required action and open the power lift gate.

In an embodiment, an emblem capacitive switch may use the original equipment manufacturer (OEM) vehicle emblem as a switch to activate automatic tail gate opening. Although a vehicle emblem is described herein, other vehicle structures or indicia may be used, such as a vehicle logo, vehicle model number and the like. Although opening a tail gate is described herein, other doors or like items can be opened using the devices and methods described herein. A switch function may be integrated into the current OEM electronic control function in place of the foot swipe currently being used. By moving the location of the switch from the foot swipe, at the undercarriage of the car, to the vehicle emblem, the user no longer has to balance on one foot or worry about dirt, snow, or ice. Instead the user must only be in proximity of the emblem using either the elbow, knee, hip, or hand. The location change makes the emblem capacitive switch easier to utilize. LED lighting may be used to indicate readiness as well as highlight switch position and add to customer brand recognition. The same switch sensor and control board may be used across multiple emblem designs. The LED lighting may change color to indicate a completion of the method.

FIG. 1 is an example of a vehicle emblem. The vehicle emblem 100 includes a housing 101 and the emblem 102.

Figure 2:
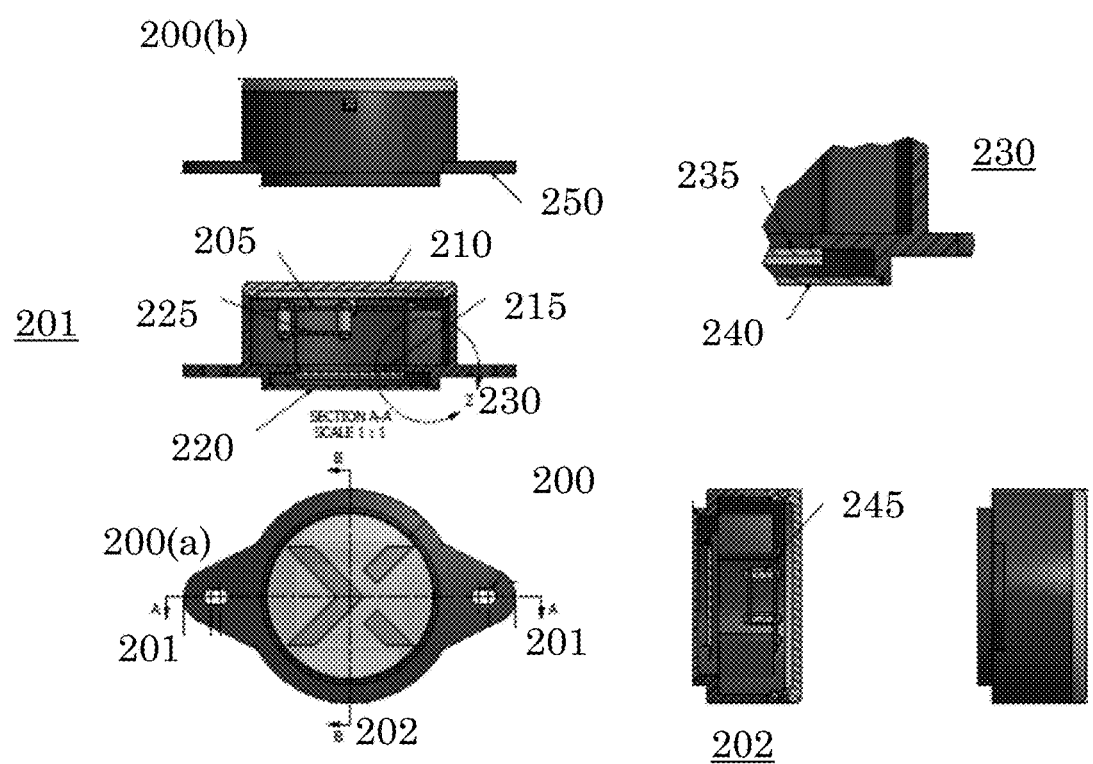
FIG. 2 is an example of the vehicle emblem with dimensions and more detail.

FIG. 2 is a more detailed illustrative example of a vehicle emblem 200. FIG. 2 shows the vehicle emblem 200 from both the top view 200(*a*) and the side view 200(*b*). The top view 200(*a*) of the vehicle emblem is illustrated with two cross-sections: cross-section A 201 and cross-section B 202. Cross-section A 201 is cut along the horizontal of the vehicle emblem 200, while cross-section B 202 is cut along the vertical of the vehicle emblem 200. In cross-section A 201 several internal components are illustrated including a driver circuit printed circuit board (PCB) 205, a cover 210, an LED backlight 215, the Flextronics logo capacitive switch 220, and a MTCH112 PCB 225. Additionally, cross-section A 201 includes detail Z 230. Detail Z 230 shows a backlight 235 and the Flextronics logo 240. Cross-section B 202 shows the PCB stand offs 245. The side view 200(*b*) of the vehicle emblem shows the housing 250. Although some dimensions are shown in FIG. 2, (where the units are in millimeters (mm)), the switch would be integrated into the OEM logo, and can be made to match the size of the logo, e.g. Ford blue oval. The depth of the switch would also be appropriate to the logo, emblem or the like. In some embodiments, the depth may be between 5 to 10 mm.

Figure 3:
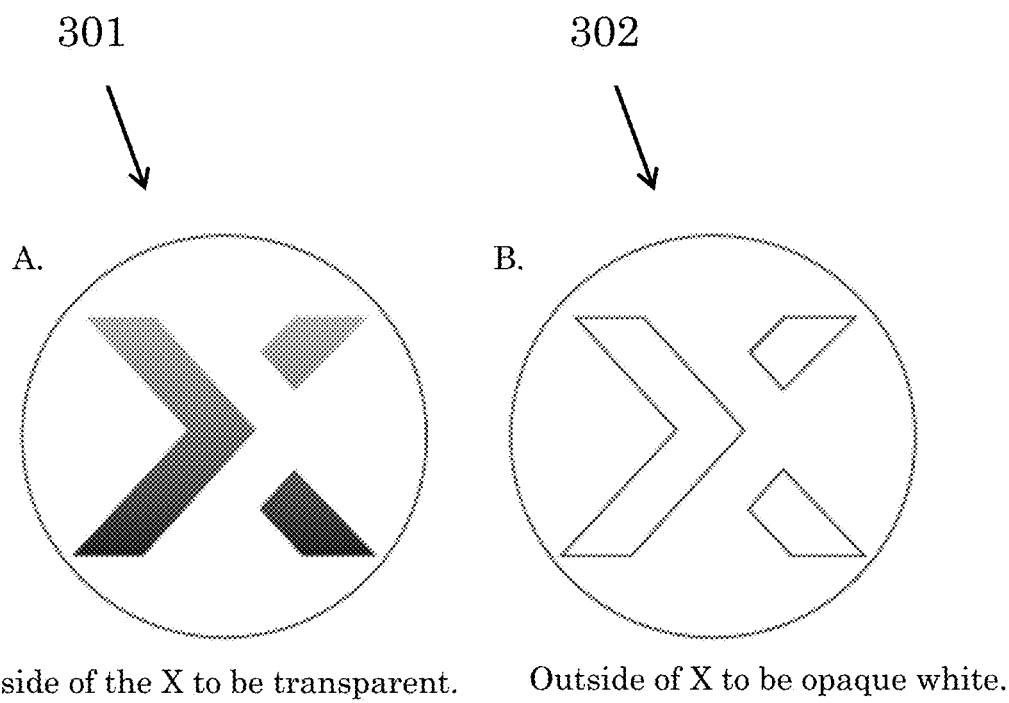
FIG. 3 is an example of a logo on the emblem.

FIG. 3 is an example of a logo on the emblem. The inside of the X 301 is transparent. The outside of the X 302 may is opaque white. In another embodiment, the inside of the X 301 is translucent.

The emblem may be made of acrylic to allow backlighting of the emblem. The emblem may have a transparent capacitive switch attached to the backside. The switch may be attached using an optically clear pressure-sensitive adhesive (PSA). The tail of the switch may plug into a printed circuit board (PCB) with driver electronics for the capacitive switch and LED lights.

Figure 4:
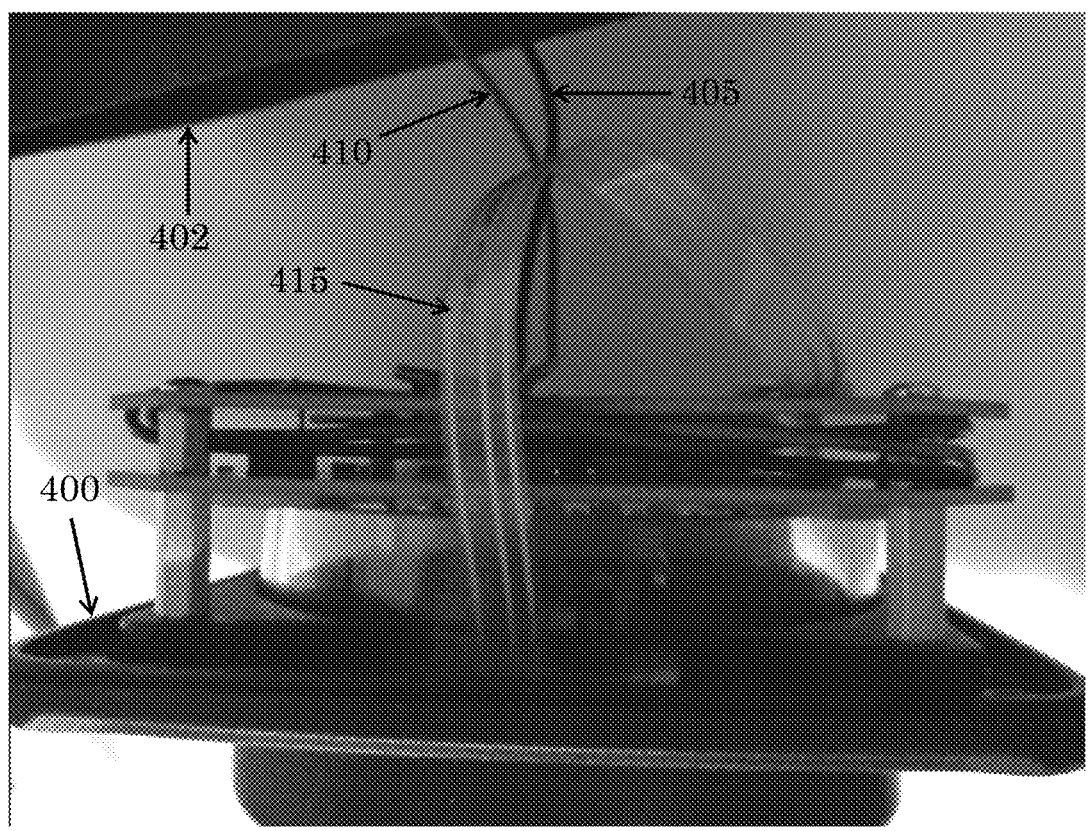
FIG. 4 is an example of the connections from the vehicle emblem to the control board.

FIG. 4 is an example of the connections from the vehicle emblem to the control board. The vehicle emblem 400 is connected to the control board 402 via 2 wires 405 and 410. The logo (not shown) is connected to the sensor (not shown) via a sensor to shield connector 415.

Figure 5:
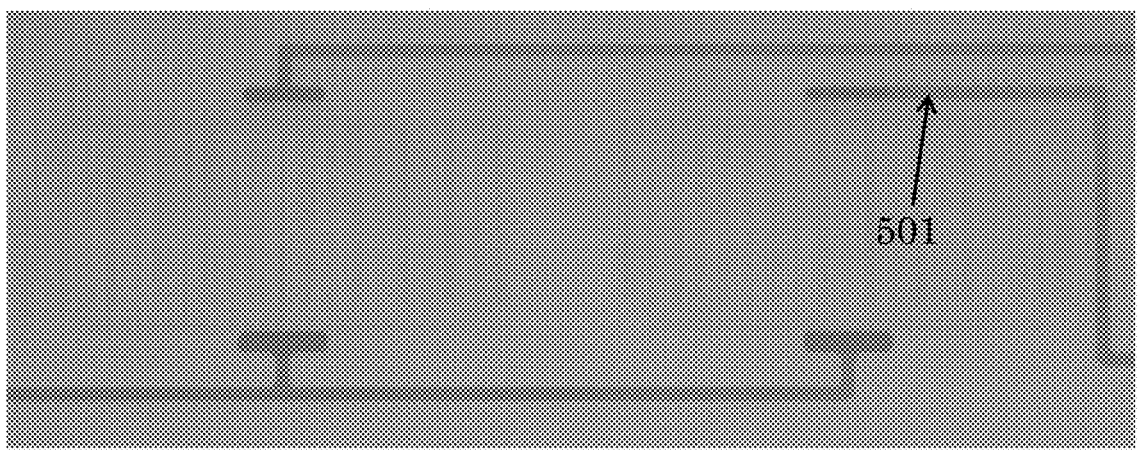
FIG. 5 is an example of the transparent capacitive switch.

FIG. 5 is an example of the transparent capacitive switch. By adjusting lighting conditions the transparent ink pattern 501 of the transparent capacitive switch 500 may be discerned in the above example, but invisible in the final assembly, making it an ideal solution for a backlit capacitive switch in this application. In another embodiment and as used herein, the capacitive switch is translucent.

Figure 6:
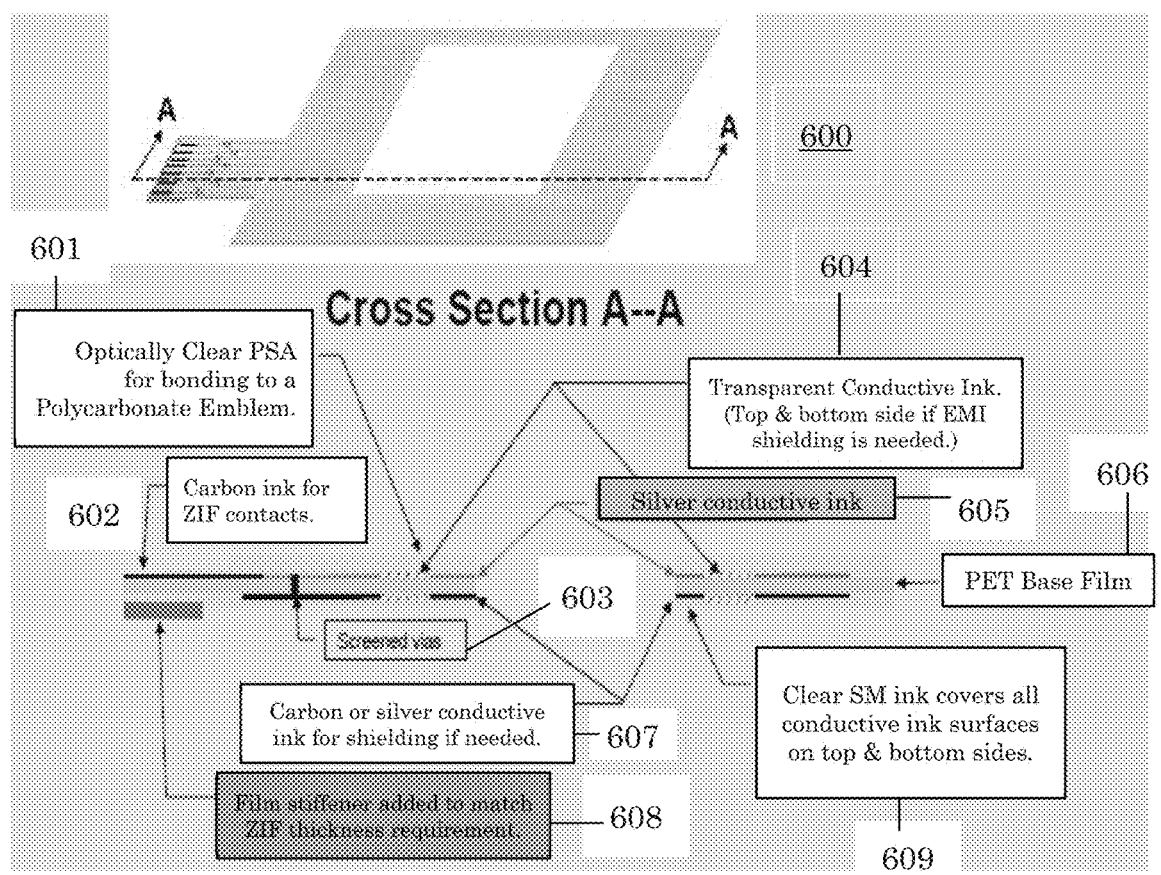
FIG. 6 is an example cross-section of the transparent capacitive switch.

FIG. 6 is an example cross-section of the transparent capacitive switch. The transparent capacitive switch 600, when cut along cross-section A, includes several layers of material. The cross section includes an optically clear PSA 601 for bonding to a polycarbonate emblem, carbon ink for ZIF contacts 602, screened via holes 603, transparent conductive ink 604 (on both the top and bottom of the capacitive switch if electromagnetic (EMI) shielding is needed), silver conductive ink 605, polyethylene terephthalate (PET) base film 606, carbon or silver conductive ink 607 (for shielding, if needed), a film stiffener 608 (added to match the ZIF thickness requirement), and a clear SM ink that covers all conductive ink surfaces on the top and bottom of the capacitive switch 609.

The transparent capacitive switch is incorporated into a capacitive sensor. The capacitive sensor is used to activate the power lift gate when a user is in proximity and performs the required action, for example, arm or hand waving, in front of the vehicle emblem.

Figure 7:
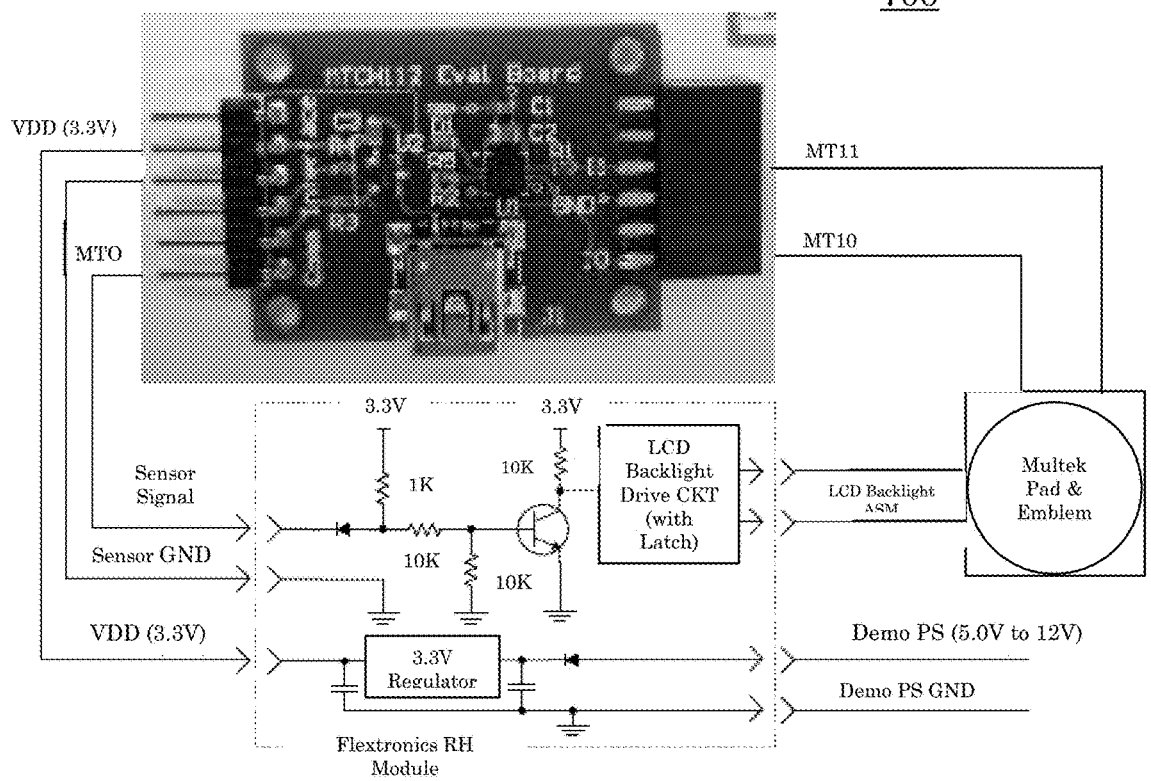
FIG. 7 is an example of a capacitive sensor system.

FIG. 7 is an example of a capacitive sensor demo system 700. It may be assumed that a power lift gate (PLG) demo system contains a battery with a voltage higher than 5.0V. It may also be assumed that, upon activation, the MTO signal is a level shift signal going from 3.3V to 0.0V with a duration of at least 5 ms. The Flextronics RH interface module includes a latching circuit. The LCD will-light up on first activation and stay on until the next sensor activation.

Figure 8:
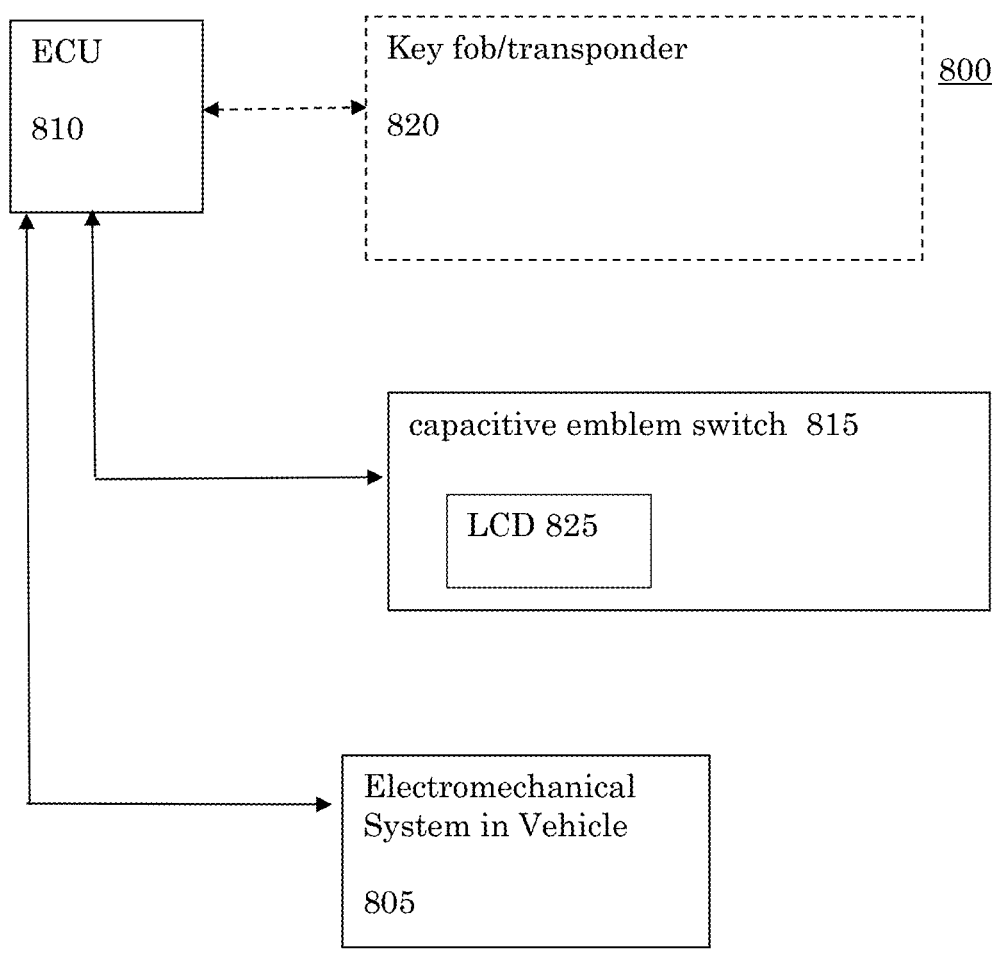
FIG. 8 is an example system of a capacitive switch emblem.

FIG. 8 is an example of a system 800 for opening an electromechanical system 805 of a vehicle. The electromechanical system 805 may be, for example, a rear hatch. The electromechanical system 805 is in communication with or connected to an electronics control unit (ECU) 810, which in turn is further in communication with or connected to a capacitive emblem switch 815. A key fob/transponder 820 may be in communication with the ECU 810, where the key fob/transponder 820 includes an identifier of the vehicle. The capacitive emblem switch 815 may include LEDs 825 or alternatively, the LEDs 825 may be in communication with or connected to the ECU 810 or the capacitive emblem switch 815. Operationally, the capacitive emblem switch 815 may be activated by a user carrying the key fob/transponder 820. The user then motions or gestures proximate to the activated capacitive emblem switch 815. The capacitive emblem switch 815 communicates with the ECU 810, which in turn signals the electromechanical systems 805 to open, for example, the rear hatch of the vehicle.

Figure 9:
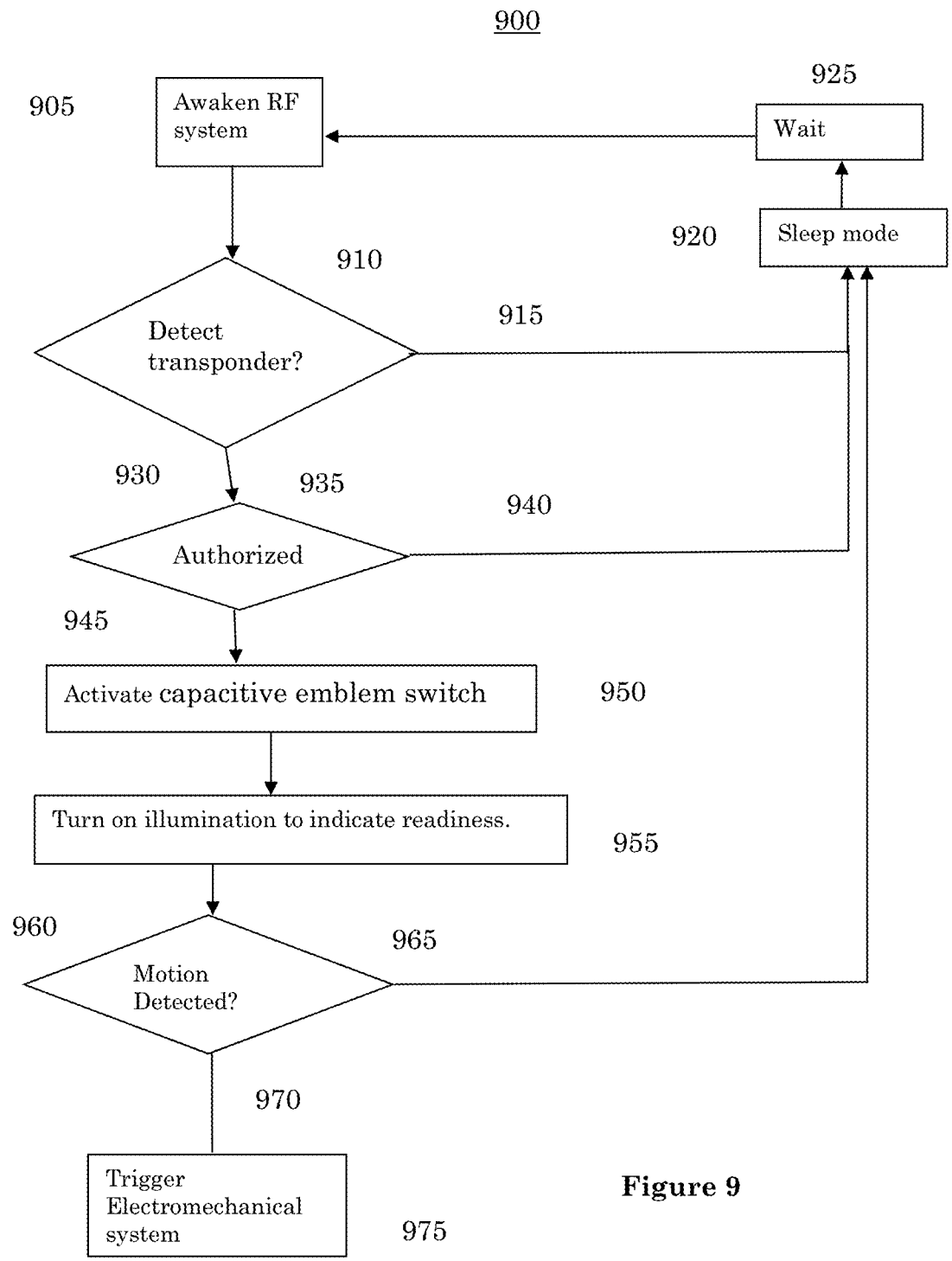
FIG. 9 is an example flowchart of opening an electromechanical system using a capacitive switch emblem.

FIG. 9 is an example of a flowchart 900 for opening an electromechanical system of a vehicle. A radio frequency (RF) system of a vehicle is awakened based on an event or on a periodic basis (905). The RF system determines whether it has detected a transponder (910). If a transponder has not been detected (915), the RF system goes into sleep mode (920) and waits for the next event or awake period (925). If a transponder has been detected (930), then an identification signal in the transponder signal is verified or authorized against a vehicle identification value (935). If the identification signal is not authorized (940), the RF system goes into sleep mode (920) and waits for the next event or awake period (925). If the identification signal is authorized (945), then a capacitive emblem switch may be activated (950). A visual signal may be activated to indicate readiness (955). For example, a light source may be illuminated to indicate readiness to the user. The capacitive emblem switch then determines if motion is detected (960). If motion is not detected (965), the RF system goes into sleep mode (920) and waits for the next event or awake period (925). If motion is detected (970), then an electromechanical system may be triggered to open (975), for example, a rear hatch of a vehicle.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the systems described herein, and are considered to be within the full scope of the invention.

Although features and elements are described above in particular combinations, each feature or element can be used alone without the other features and elements or in various combinations with or without other features and elements.

What is claimed:

1. A method for opening a rear hatch of a vehicle, the method comprising:
   approaching the vehicle, by a user, with a transponder, wherein the transponder includes an identifier of the vehicle;

detecting of the transponder by the vehicle;
verifying by the vehicle, an identification signal transmitted by the transponder;
activating a capacitive emblem switch with the transponder following verification of the identification signal transmitted by the transponder;
illuminating LED lights in response to activation of the capacitive emblem switch to highlight a position of the capacitive emblem switch and indicate activation of the capacitive emblem switch;
motioning in front of the activated capacitive emblem switch; and
opening the rear hatch of the vehicle.

2. The method of claim 1, wherein the capacitive emblem switch is incorporated into a vehicle logo.

3. The method of claim 1, wherein the capacitive emblem switch is incorporated into a vehicle model number.

4. The method of claim 1, wherein the LED lights change color to indicate a completion of the method.

5. The method of claim 1, wherein the capacitive emblem switch is at least one of translucent or transparent.

6. The method of claim 1, wherein the transponder is a key fob.

7. A capacitive emblem switch comprising:
circuitry configured to activate the capacitive emblem switch when a user approaches a vehicle with a transponder, wherein the transponder includes an identifier of the vehicle;
circuitry configured to turn on LED lights in response to activation of the capacitive emblem switch; and
circuitry configured to open an electromechanical system of the vehicle when the user is in proximity to the activated capacitive emblem switch and motions in front of the activated capacitive emblem switch,
wherein the capacitive emblem switch detects the transponder and verifies an identification signal transmitted by the transponder prior to activation of the capacitive emblem switch, and
the LED lights are used to illuminate a position of the capacitive emblem switch and indicate activation of the capacitive emblem switch.

8. The capacitive emblem switch of claim 7, wherein the capacitive emblem switch is incorporated into a vehicle logo.

9. The capacitive emblem switch of claim 7, wherein the capacitive emblem switch is incorporated into a vehicle model number.

10. The capacitive emblem switch of claim 7, wherein the LED lights change color to indicate a completion of the method.

11. The capacitive emblem switch of claim 7, wherein the capacitive emblem switch is at least one of translucent or transparent.

12. A system for opening an electromechanical system of a vehicle by a user comprising:
a capacitive emblem switch;
LED lights; and
a transponder that transmits an identification signal, wherein
the capacitive emblem switch is activated when the user is in proximity of the vehicle with the transponder, and the identification signal transmitted by the transponder is verified by the capacitive emblem switch,
the LED lights, in response to activation of the capacitive emblem switch, highlight a position of the capacitive emblem switch and indicate activation of the capacitive emblem switch, and
the electromechanical system of the vehicle opens when the user motions in front of the activated capacitive emblem switch.

13. The system of claim 12, wherein the capacitive emblem switch is incorporated into a vehicle logo.

14. The system of claim 12, wherein the capacitive emblem switch is incorporated into a vehicle model number.

15. The system of claim 12, wherein the LED lights change color to indicate a completion of the method.

16. The system of claim 12, wherein the capacitive emblem switch is at least one of translucent or transparent.

17. The system of claim 12, wherein the transponder is a key fob.

* * * * *